(12) United States Patent
Maier

(10) Patent No.: US 12,293,898 B2
(45) Date of Patent: May 6, 2025

(54) PLASMA IGNITION DETECTION DEVICE FOR CONNECTION TO AN IMPEDANCE MATCHING CIRCUIT FOR A PLASMA GENERATING SYSTEM

(71) Applicant: TRUMPF Hüttinger GmbH + Co. KG, Freiburg (DE)

(72) Inventor: Florian Maier, Pfaffenweiler (DE)

(73) Assignee: TRUMPF HÜTTINGER GMBH + CO. KG, Freiburg (DE)

( * ) Notice: Subject to any disclaimer, the term of this patent is extended or adjusted under 35 U.S.C. 154(b) by 0 days.

(21) Appl. No.: 18/907,614

(22) Filed: Oct. 7, 2024

(65) Prior Publication Data

US 2025/0104973 A1     Mar. 27, 2025

Related U.S. Application Data

(63) Continuation of application No. PCT/EP2023/059194, filed on Apr. 6, 2023.

(30) Foreign Application Priority Data

Apr. 8, 2022   (DE) .................. 10 2022 108 642.9

(51) Int. Cl.
    *H01J 37/32*   (2006.01)
(52) U.S. Cl.
    CPC .... *H01J 37/32183* (2013.01); *H01J 37/3299* (2013.01)
(58) Field of Classification Search
    None
    See application file for complete search history.

(56) References Cited

U.S. PATENT DOCUMENTS 5,793,162 A * 8/1998 Barnes ............. H01J 37/32174
                                                     315/111.21
5,929,717 A * 7/1999 Richardson ....... H01J 37/32183
                                                            702/65
(Continued)

FOREIGN PATENT DOCUMENTS

DE          19927063 B4    3/2005
DE    102009051988 A1      5/2010
(Continued)

*Primary Examiner* — Srinivas Sathiraju
(74) *Attorney, Agent, or Firm* — LEYDIG, VOIT & MAYER, LTD.

(57) ABSTRACT

A plasma ignition detection device for connecting to an impedance matching circuit for a plasma generation system is configured to process first time-variant measured values from a first predetermined location of the impedance matching circuit. An applied first reactive and/or active power is capable of being determined from the first time-variant measured values. The plasma ignition detection device is further configured to process second time-variant values associated with a second location of the impedance matching circuit, the second location being different to the first predetermined location. An applied second reactive and/or active power is capable of being determined from the second time-variant values. The plasma ignition detection device is further configured to determine a first time-variant variable from the first time-variant measured values, determine a second time-variant variable from the second time-variant values, and generate an output signal describing a plasma state, depending on the first and second time-variant variables.

15 Claims, 9 Drawing Sheets

(56) References Cited

U.S. PATENT DOCUMENTS

| | | | |
|---|---|---|---|
| 7,353,771 B2* | 4/2008 | Millner | H05H 1/46 |
| | | | 118/723 R |
| 8,238,396 B2* | 8/2012 | Ikemoto | H01S 3/134 |
| | | | 372/38.07 |
| 8,929,414 B2* | 1/2015 | Honda | H01S 3/09702 |
| | | | 372/38.07 |
| 9,699,878 B2* | 7/2017 | Yuzurihara | H01J 37/32935 |
| 10,002,749 B2* | 6/2018 | Grede | H01J 37/32944 |
| 10,224,184 B2* | 3/2019 | Van Zyl | H01J 37/32146 |
| 10,285,256 B2* | 5/2019 | Jevtic | H05H 1/30 |
| 11,092,129 B2* | 8/2021 | Asakura | F02P 3/0876 |
| 11,114,279 B2* | 9/2021 | Oliveti | H01J 37/32944 |
| 11,410,832 B2* | 8/2022 | Funk | H01J 37/244 |
| 11,574,799 B2* | 2/2023 | Oliveti | H01J 37/32183 |
| 11,610,763 B2* | 3/2023 | Van Zyl | H01J 37/32183 |
| 11,615,943 B2* | 3/2023 | Van Zyl | H01J 37/32183 |
| | | | 315/111.21 |
| 11,651,939 B2* | 5/2023 | Van Zyl | H03H 7/40 |
| | | | 315/111.21 |
| 11,657,980 B1* | 5/2023 | Poghosyan | H01G 5/014 |
| | | | 361/278 |
| 11,804,362 B2* | 10/2023 | Van Zyl | H01J 37/32183 |
| 12,020,901 B2* | 6/2024 | Guo | H03H 7/40 |
| 12,040,139 B2* | 7/2024 | Oliveti | H01G 5/14 |
| 12,051,549 B2* | 7/2024 | Oliveti | H01G 5/0132 |
| 12,132,435 B2* | 10/2024 | Oliveti | H02P 6/182 |
| 2005/0040144 A1 | 2/2005 | Sellers | |
| 2007/0103092 A1* | 5/2007 | Millner | H01J 37/321 |
| | | | 315/276 |
| 2010/0225411 A1 | 9/2010 | Maier | |
| 2013/0002136 A1 | 1/2013 | Blackburn et al. | |
| 2014/0064317 A1 | 3/2014 | Honda et al. | |
| 2014/0307754 A1 | 10/2014 | Nukui | |
| 2015/0287576 A1* | 10/2015 | Grede | H01J 37/32064 |
| | | | 315/111.21 |
| 2016/0217975 A1 | 7/2016 | Leypold et al. | |
| 2017/0330731 A1* | 11/2017 | Van Zyl | H01J 37/32183 |
| 2017/0345620 A1* | 11/2017 | Coumou | H03F 1/3223 |
| 2018/0053633 A1 | 2/2018 | Glazek et al. | |
| 2018/0261432 A1* | 9/2018 | Ashida | H01J 37/32201 |
| 2019/0176201 A1* | 6/2019 | Angerer | B21D 5/02 |
| 2019/0210083 A1* | 7/2019 | Angerer | B21D 55/00 |
| 2019/0217358 A1* | 7/2019 | Angerer | B21D 5/004 |
| 2020/0411290 A1* | 12/2020 | Oliveti | H01J 37/32944 |
| 2021/0175050 A1* | 6/2021 | Van Zyl | H01J 37/32174 |
| 2021/0287880 A1* | 9/2021 | Van Zyl | H01J 37/32183 |
| 2021/0391148 A1* | 12/2021 | Oliveti | H01J 37/32183 |
| 2021/0407771 A1* | 12/2021 | Funk | H01J 37/3299 |
| 2022/0244622 A1* | 8/2022 | Maier | G03B 17/18 |
| 2022/0395349 A1* | 12/2022 | Maier | G01R 33/4818 |
| 2022/0414877 A1* | 12/2022 | Krafft | A61B 5/7425 |
| 2023/0022454 A1* | 1/2023 | Wilking | G06F 21/6227 |
| 2023/0026862 A1* | 1/2023 | Angerer | B21D 5/004 |
| 2023/0231543 A1* | 7/2023 | Van Zyl | H03H 7/40 |
| | | | 327/551 |
| 2024/0094273 A1* | 3/2024 | Guo | H01J 37/32917 |
| 2024/0105431 A1 | 3/2024 | Maier | |
| 2024/0203689 A1* | 6/2024 | Van Zyl | H01J 37/32045 |
| 2024/0203711 A1* | 6/2024 | Kapoor | H01J 37/32935 |
| 2024/0382103 A1* | 11/2024 | Faust | G01R 33/286 |

FOREIGN PATENT DOCUMENTS

| | | |
|---|---|---|
| DE | 102009001355 A1 | 9/2010 |
| DE | 102013109593 A1 | 3/2014 |
| DE | 102013110883 B3 | 1/2015 |
| DE | 102019200761 A1 | 7/2020 |
| DE | 202021103238 U1 | 6/2021 |
| EP | 3091559 A1 | 11/2016 |
| WO | WO 9724748 A1 | 7/1997 |
| WO | WO 2012094416 A1 | 7/2012 |
| WO | WO 2014094738 A2 | 6/2014 |

\* cited by examiner

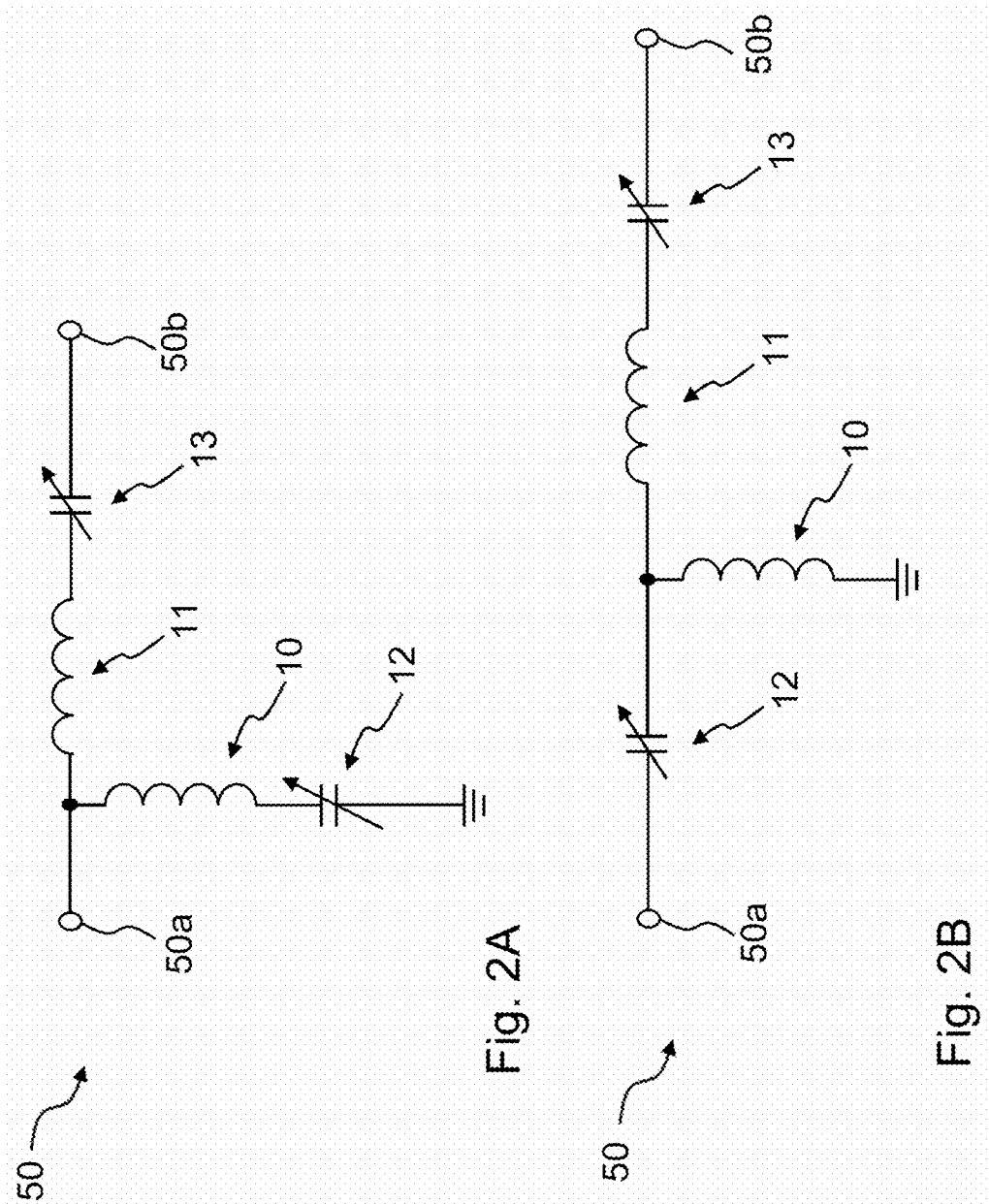

PLASMA IGNITION DETECTION DEVICE FOR CONNECTION TO AN IMPEDANCE MATCHING CIRCUIT FOR A PLASMA GENERATING SYSTEM

CROSS REFERENCE TO RELATED APPLICATIONS

This application is a continuation of International Application No. PCT/EP2023/059194 (WO 2023/194551 A1), filed on Apr. 6, 2023, and claims benefit to German Patent Application No. DE 10 2022 108 642.9, filed on Apr. 8, 2022.

FIELD

Embodiments of the present invention relate to a plasma ignition detection device for connecting to an impedance matching circuit for a plasma generation system and to a plasma generation system having a plasma ignition detection device of this kind.

BACKGROUND

The surface treatment of workpieces using plasma and gas lasers are industrial processes in which a plasma is generated, in particular in a plasma chamber, using direct current or a high-frequency alternating signal at an operating frequency in the range of several 10 kHz up to the GHz range. The plasma chamber is connected to a radio-frequency generator (RF generator) via other electronic components, such as coils, capacitors, lines or transformers. These other components may represent resonant circuits, filters or impedance matching circuits.

In a plasma process, there is often the problem that the electrical load impedance of the plasma chamber (the plasma=consumer) that arises during the process depends on the conditions in the plasma chamber and can vary greatly. In particular, the properties of the workpiece, electrodes and gas ratios are taken into account.

Radio-frequency generators have a limited operating range with respect to the impedance of the connected electrical load (=consumer). If the load impedance leaves a permissible range, the RF generator may be damaged or even destroyed.

For this reason, an impedance matching circuit (matchbox) which transforms the load impedance to a nominal impedance of the generator output (often 50 ohms) is usually required. In the event of a mismatch, the full generator power cannot be delivered to the load. Instead, some of the power is reflected. In the range of nominal impedance, there is an impedance range, that is to say a range of transformed load impedances in which the generator operates stably and is not damaged. If the transformed load impedance is outside this nominal impedance range, damage to and instability in the generator may occur due to reflected power.

Various impedance matching circuits are known. Either the impedance matching circuits are fixed and have a predetermined transformation effect, that is to say they consist of electrical components, in particular coils and capacitors, which are not changed during operation. This is expedient when the operation is always constant, such as in the case of a gas laser, for example. Furthermore, impedance matching circuits in which at least some of the components of the impedance matching circuits are mechanically variable are known. For example, motor-operated variable capacitors are known, the capacitance value of which can be changed by changing the arrangement of the capacitor plates relative to one another.

Three impedance ranges can be assigned to a plasma at first glance. There are very high impedances present before ignition. Lower impedances are present during normal operation, that is to say when operating with plasma as intended. Very small impedances may occur in the case of unwanted local discharges (arcs) or plasma fluctuations. In addition to these three identified impedance ranges, other special states with other assigned impedance values may arise. If the load impedance changes abruptly and the load impedance or the transformed load impedance leaves a permissible impedance range, the RF generator or else transmission devices between the RF generator and the plasma chamber may be damaged. There are also stable states of the plasma that are not desired.

For example, an impedance matching circuit is described in DE 10 2009 001 355 A1.

It may still be difficult to determine whether or not the plasma is ignited. If the plasma does not ignite when the RF generator is switched on, the resulting "cold" impedance may be within the matching range of the impedance matching circuit (matchbox). The impedance matching circuit matches this impedance (mainly due to intrinsic losses). However, there is still matching for the RF generator. This behaviour is stochastic and difficult to detect.

SUMMARY

Embodiments of the present invention provide a plasma ignition detection device for connecting to an impedance matching circuit for a plasma generation system is configured to process first time-variant measured values from a first predetermined location of the impedance matching circuit. An applied first reactive and/or active power is capable of being determined from the first time-variant measured values. The plasma ignition detection device is further configured to process second time-variant values which are associated with a second location of the impedance matching circuit. The second location is different to the first predetermined location. An applied second reactive and/or active power is capable of being determined from the second time-variant values. The plasma ignition detection device is further configured to determine a first time-variant variable from the first time-variant measured values, determine a second time-variant variable from the second time-variant values, and generate an output signal which describes a plasma state, depending on the first and second time-variant variables.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIGS. 2A-2C show various exemplary embodiments of the impedance matching circuit;

DETAILED DESCRIPTION

Figure 1:
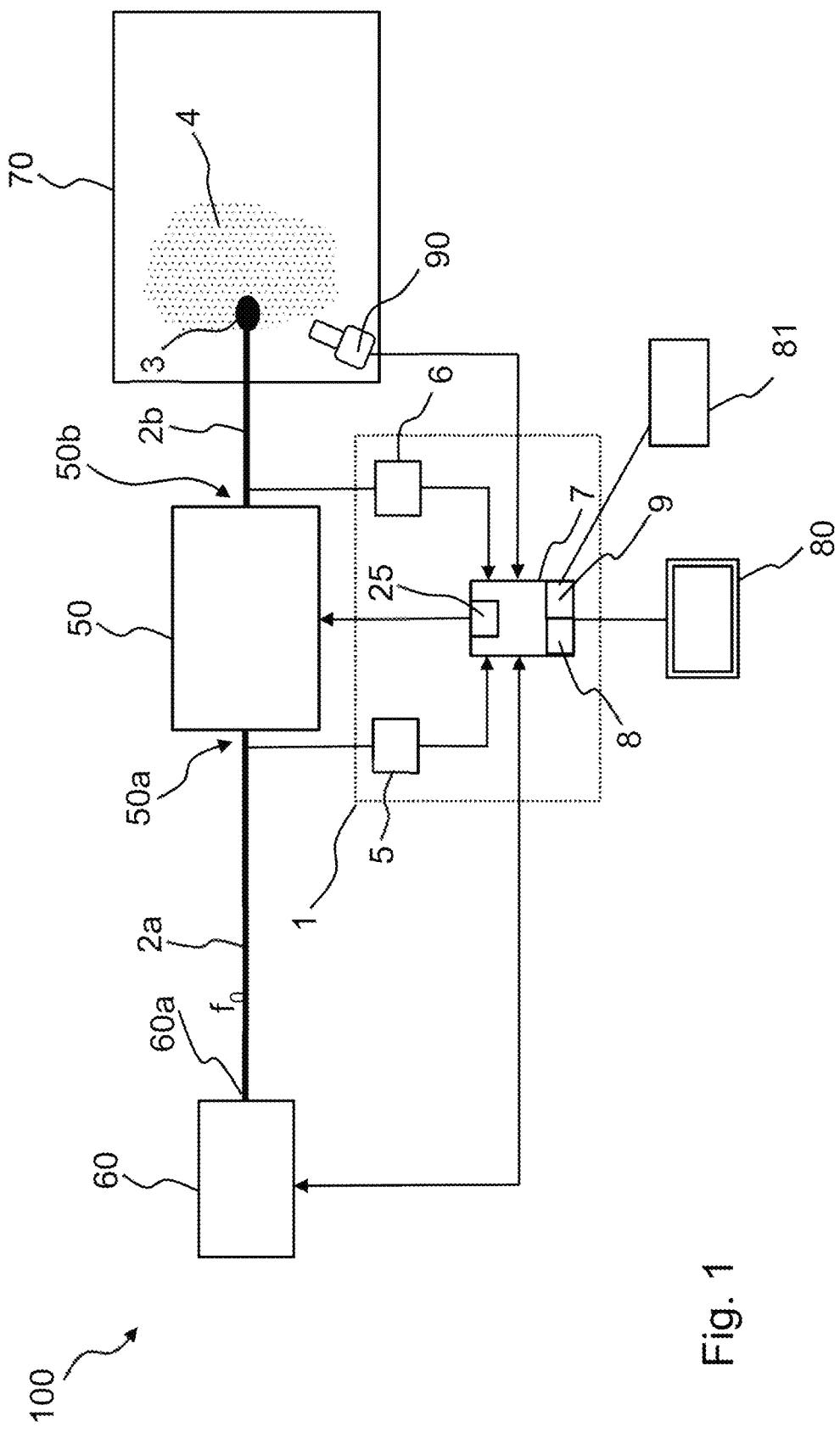
FIG. 1 shows an exemplary embodiment of a plasma generation system comprising an RF generator, an impedance matching circuit, a plasma ignition detection device and a plasma chamber.

Embodiments of the present invention provide a plasma ignition detection device and a plasma generation system having a plasma ignition detection device of this kind, using which more precise statements about the plasma (ignited, not ignited, etc.) can be made and using which a desired plasma state can be set.

The plasma ignition detection device according to embodiments of the invention is used for connecting to an impedance matching circuit for a plasma generation system. The plasma ignition detection device is designed to process first time-variant measured values. Said first time-variant measured values represent applied physical variables at a first predetermined location in the impedance matching circuit. For example, said first predetermined location may be an input. An applied first reactive and/or active power can be determined from said first time-variant measured values. The term "time-variant" is to be understood to mean that the measured values may change over time. The plasma ignition detection device is furthermore designed to process second time-variant values. Said second time-variant values represent applied physical variables at a second predetermined location in the impedance matching circuit. For example, said second predetermined location may be an output. The first predetermined location and the second predetermined location are separated from one another, that is to say spaced apart from one another. This means that additional elements (for example capacitors, coils, etc.) are arranged between the two locations. An applied second reactive and/or active power can be determined from said second time-variant values. The plasma ignition detection device is further designed to determine a first time-variant variable from the first measured values. The plasma ignition detection device is also designed to determine a second time-variant variable from the second values. The plasma ignition detection device is furthermore designed to generate an output signal which preferably describes a plasma state, depending on the first and second time-variant variables. The term "depending on" is to be understood as meaning that both the first time-variant variable and the second time-variant variable are taken into account. For example, the term "describes" may mean indicating whether the plasma is ignited as desired (for example fully ignited) or not. This may mean indicating that plasma processing is in progress, that the plasma is partially ignited, that plasma processing is not possible, or that the plasma is not ignited. It is also conceivable to state that a certain process has been completed (for example an etching process has been completed), because this can also be used to infer the state of the plasma. Changes over time in the output signal can also be used to infer a changing plasma, and so these changes over time in turn describe the plasma. The output signal changes in particular depending on the plasma state.

It is advantageous that time-variant measured values and time-variant values from which a respective reactive and/or active power can be determined are recorded and that these measured values or values are processed in such a way as to produce corresponding time-variant variables therefrom. The fact that reactive and/or active powers can be determined means that there is an exact phase relationship with an accuracy of preferably less than 3°, 1°, 0.5° or less than 0.2° between individual variables, which is why the ratio of the individual measured variables or values with respect to one another can be specified more accurately than in the prior art. Thanks to this additional information, it is possible to obtain much more accurate information about the current plasma state using the plasma ignition detection device according to embodiments of the invention than was previously possible.

The output signal is preferably a control command for actuating the impedance matching circuit. This ensures that the RF generator of the plasma generation system sees a match. In addition or as an alternative, the output signal may also be a control command for the RF generator of the plasma generation system. This control command thus enables the RF generator to be switched on or off and/or for its frequency and/or power to be changed. The control commands are then primarily used to be able to set a desired plasma state. In addition or as an alternative, the output signal is an output message which is displayed, for example, on a screen and/or is transferred to a higher-level controller. The operators of the plasma generation system can thus be informed about desired and/or undesired states of the plasma in the plasma chamber.

In one development, the plasma ignition detection device comprises a storage device. Said storage device is preferably a non-volatile memory. With respect to different:
  a) first and second time-variant variables; and/or
  b) first and second reactive and/or active powers; and/or
  c) ratios of first and second reactive and/or active powers,
   control commands for the impedance matching circuit and/or for the RF generator are stored in the storage device. This can be carried out, for example, in the context of a look-up table. The plasma ignition detection device is designed to take:
  a) the current first and second time-variant variables; and/or
  b) the current first and second reactive and/or active powers; and/or
  c) the ratios of current first and second reactive and/or active powers;
   as a basis for loading the corresponding control command for the impedance matching circuit and/or the RF generator from the storage device and transmitting same to the impedance matching circuit and/or to the RF generator.

The term "current" is to be understood in such a way that the plasma ignition detection device always generates new, that is to say current, time-variant variables from current time-variant measured values or values during operation. Said time-variant measured values or values change because the plasma is not constant. In this way, it is possible to generate corresponding control commands very efficiently.

When forming a ratio between the different powers, the efficiency can be determined independently of the absolute input power or output power. Due to the ratio formation, this advantageously functions not only in certain operating states, but in a large value range of operating states.

In one development, the plasma ignition detection device comprises an AI module. Said AI module is preferably trained by the manufacturer in order to take:
a) the first and second time-variant variables; and/or
b) the first and second reactive and/or active powers; and/or
c) ratios of first and second reactive and/or active powers;
as a basis for generating the control command for the impedance matching circuit and/or for the RF generator. Actual measured values from existing plasma generation systems can be used as the basis for the training data. In this case, "supervised learning" can be used. The use of "unsupervised learning" is also conceivable.

In one development, the plasma ignition detection device is designed:
a) to interlink the first time-variant variable and the second time-variant variable by way of at least one mathematical operation; and/or
b) to interlink the first reactive and/or active power and the second reactive and/or active power by way of at least one mathematical operation;
in order to generate the output signal depending on this result. The fact that the first and second time-variant variable or the first and second reactive and/or active power have been determined for two different locations enables very efficient determination of the state of the current plasma. If significantly more active power (preferably more than 15%, 25%, 50%, 100%, 200%, 300%, 400%, 500% or more than 600%) is transferred into the impedance matching circuit than said circuit delivers to the plasma, it can be assumed that the plasma is not in the desired state.

In one development, the plasma ignition detection device is designed to divide the second reactive and/or active power by the first reactive and/or active power in order to calculate an efficiency in order to generate the output signal as a function of the efficiency. It has been established by lengthy studies that efficiency, which requires precise knowledge of the phase relationships (for example between current and voltage) in order to be determined, is a very good criterion for describing the plasma state. Low efficiency indicates that the plasma is in an undesired state.

In one development, the plasma ignition detection device is designed to generate the output signal only when:
a) the first time-variant variable and/or the first reactive and/or active power exceeds a threshold value; and/or
b) the second time-variant variable and/or the second reactive and/or active power exceeds a threshold value.

For example, it has been determined that the impedance matching circuit and/or the RF generator should only be regulated at or above a certain level for efficiency. Until the output signal is generated, the RF generator is activated and/or the impedance matching circuit is placed in a basic or starting state. If the RF generator and/or the impedance matching circuit are regulated too early based on the output signal, difficulties could otherwise arise and it would not be possible to achieve a stable state. The output signal is preferably only output when the efficiency exceeds a level of 5%, 10%, 15%, 20%, 25%, 30%, 35%, 40%, 45% or more than 45%. Until then, start-up programs that are already known are preferably executed.

In one development, the first time-variant variable is a reactive power or an active power. In addition or as an alternative, the second time-variant variable is a reactive power or an active power. The two variables have in common the fact that an exact phase relationship for the time-variant measured values or the time-variant values must be known at the first and second location in order for said variables to be calculated. This makes it possible to determine the plasma state very accurately.

In one development, the plasma ignition detection device is designed to calculate:
a) the first harmonic wave; or
b) the first and second harmonic waves
of the second reactive and/or active power. The plasma ignition detection device is further designed to also generate the output signal depending on power of:
a) the first harmonic wave; or
b) the first and second harmonic waves;
of the second reactive and/or active power. It has been identified that stable states of the plasma can also occur, which are not desirable. Such states can be detected, for example, by analysing the harmonic waves. Preferably, only the first harmonic wave or the first and second harmonic waves are detected at the second location, wherein the second location is arranged at the output of the impedance matching circuit or closer to the output of the impedance matching circuit than the first location. Furthermore, the efficiency can be calculated more accurately if the first or the first and second harmonic waves of the second reactive and/or active power are also determined. The harmonic waves, also referred to as "harmonics", are produced by the nonlinearity of the plasma. An impedance matching circuit acts as a filter for these harmonics. A large proportion of these harmonics can therefore be better measured at the output of the impedance matching circuit. This is not absolutely necessary for the first reactive and/or active power because these are preferably determined at the input of the impedance matching circuit and thus close to the RF generator and the RF generator only provides a fundamental oscillation.

In one development, the first location is situated in a region of an RF input of the impedance matching circuit and the second location is situated in a region of an RF output of the impedance matching circuit. As an alternative, this could also be the other way around. In this case, the first location would be situated in a region of an RF output of the impedance matching circuit and the second location would be situated in a region of an RF input of the impedance matching circuit. In this case, the first and second harmonic waves could be determined at the first location. In principle, this enables the most accurate values for the first and second time-variant variables to be determined, in particular because both locations are spaced as far apart as possible from one another in this case.

In one development, a first measuring unit is provided, wherein the first measuring unit is designed to determine the first time-variant measured values at the first predetermined location of the impedance matching circuit, where the determination is carried out by physical measurement. Furthermore, a second measuring unit is provided, wherein the second measuring unit is designed to determine the second time-variant values, wherein:
a) the determination by physical measurement is carried out at the second location, which is why the second time-variant values are likewise time-variant measured values; or
b) the determination is carried out by a calculation based on a physical model of the impedance matching circuit and:
i) the first time-variant measured values; and/or
ii) the first time-variant variable.

In this case, the first measuring unit is a real measuring unit. Depending on the embodiment, the second measuring unit may be a real measuring unit or a virtual measuring unit. If the second measuring unit is a virtual measuring unit, the first time-variant measured values or the first time-variant variable can be used as input variables. Furthermore, the current setting of the impedance matching circuit (for example the current value of the adjustable capacitances and/or inductances) can also be used. The second time-variant values and from these the second time-variant variable can then be determined from these variables. Parasitic elements, in particular resistive losses of the components, can be taken into account here. This enables efficiency calculations to be made more reliably.

In one development, the first and/or second measuring unit comprises a directional coupler. Such a directional coupler can be used to determine a reactive and/or active power in a simple manner. In an alternative and/or additional development, the first and/or second measuring unit comprises a voltage/current detector, in particular with a phase detector for determining the phase between voltage and current. Such a detector can be used to determine a reactive and/or active power in a simple manner.

In one development, the first time-variant measured values are powers of the incoming and outgoing wave (of the first measuring unit) and the second time-variant measured values are powers of the outgoing and incoming wave (of the second measuring unit). The plasma ignition detection device is designed to subtract the power of the outgoing wave from the power of the incoming wave in order to thereby calculate the first time-variant variable. The plasma ignition detection device is furthermore designed to subtract the power of the incoming wave from the power of the outgoing wave in order to thereby calculate the second time-variant variable.

In one development, the first measuring unit (instead of a directional coupler) comprises a current sensor and a voltage sensor. In this case, the first time-variant measured values include a current and a voltage, and in particular the phase between said current and said voltage. In addition or as an alternative, the second measuring unit (instead of a directional coupler) comprises a current sensor and a voltage sensor. In this case, the second time-variant measured values comprise a current and a voltage and optionally also a phase. In principle, the first measuring unit could comprise a current sensor and a voltage sensor, whereas the second measuring unit comprises a directional coupler. The reverse would also be conceivable. Preferably, however, both the first measuring unit and the second measuring unit comprise an appropriate current sensor and a voltage sensor. Using sensors of this kind makes very accurate measurements possible.

In one development, the first time-variant measured values are a complex current and a complex voltage. In addition or as an alternative, the second time-variant measured values are a complex current and a complex voltage. It is very important here that a phase relationship between current and voltage, which can be used to calculate the reactive and/or active power, can be determined precisely. This makes it possible to make very accurate statements about the efficiency, that is to say how much of the power provided by the RF generator is also actually absorbed by the plasma. The plasma state can ultimately be described by this.

In one development, the plasma ignition detection device is designed to calculate the first active power from the first time-variant measured values as follows:

$$|U| \cdot |I| \cdot \cos(\varphi_U - \varphi_I) \text{ or } |U| \cdot |I| \cdot \cos(\varphi_I - \varphi_U)$$

where $\varphi_U$=phase voltage and $\varphi_I$=phase current; and/or the plasma ignition detection device is designed to calculate the second active power from the second time-variant measured values as follows:

$$|U| \cdot |I| \cdot \cos(\beta_U - \varphi_I) \text{ or } |U| \cdot |I| \cdot \cos(\varphi_I - \varphi_U)$$

where $\varphi_U$=phase voltage and $\varphi_I$=phase current.

In addition or as an alternative, the plasma ignition detection device is designed to calculate the first reactive power from the first time-variant measured values as follows:

$$|U| \cdot |I| \cdot \sin(\varphi_U - \varphi_I) \text{ or } |U| \cdot |I| \cdot \sin(\varphi_I - \varphi_U)$$

where $\varphi_U$=phase voltage and $\varphi_I$=phase current; and/or the plasma ignition detection device is designed to calculate the second reactive power from the second time-variant measured values as follows:

$$|U| \cdot |I| \cdot \sin(\varphi_U - \varphi DI) \text{ or } |U| \cdot |I| \cdot \sin(\varphi_I - \varphi_U)$$

where $\varphi_U$=phase voltage and $\varphi_I$=phase current.

It can be seen that the respective active power or the respective reactive power can be calculated more precisely, the more accurately the phase can be determined.

In one development, the plasma ignition detection device comprises a first and a second A/D converter and a first and a second I/Q demodulator. The first A/D converter is designed to digitize first time-variant measured values for the current, with the first I/Q demodulator being connected to the output of the first A/D converter. The second A/D converter is designed to digitize first time-variant measured values for the voltage, with the second I/Q demodulator being connected to the output of the second A/D converter. In addition or as an alternative, the plasma ignition detection device comprises a third and a fourth A/D converter and a third and a fourth I/Q demodulator. The third A/D converter is designed to digitize second time-variant measured values for the current, with the third I/Q demodulator being connected to the output of the third A/D converter. The fourth A/D converter is designed to digitize second time-variant measured values for the voltage, with the fourth I/Q demodulator being connected to the output of the fourth A/D converter. The respective A/D converter can also be integrated in a common housing or in a common chip together with the respective I/Q demodulator. Multiple A/D converters can also be integrated on one chip or in one housing. In particular, the A/D converters can be operated synchronously. In this way, the phase relationship can be determined very accurately.

As an alternative or in addition, the I/Q demodulation can be performed in time multiplex. This can be done by switching over from channel to channel. In this case, not all variables can be measured at the same time, but they can be measured with a time offset. If the channels are of identical structure, the variables would be reusable.

In one development, the plasma ignition detection device is designed to set the clock rate of the third and fourth A/D converters in such a way that:

a) a fundamental oscillation of an RF generator and a second harmonic of the RF generator, wherein the second harmonic of the RF generator is mirrored at the Nyquist frequency of the third and fourth A/D converter; or b) a fundamental oscillation of an RF generator, a second harmonic of the RF generator and a third harmonic of the RF generator, wherein the second and third harmonics of the RF generator are mirrored at the Nyquist frequency of the third and fourth A/D converter;

are spaced apart from one another by a predetermined or maximum frequency range below the Nyquist frequency.

As an alternative or in addition, the fundamental oscillation may also already be in the second Nyquist zone and the harmonics may then be in different zones. This very efficient procedure makes it possible that an A/D converter that is operated, for example, at a clock rate of 50 MHz can be used to digitize signals whose frequency is above 25 MHz. If, for example, the fundamental oscillation (first harmonic) is 13.56 MHz, this fundamental oscillation can be easily digitized. The second harmonic (first harmonic wave) is at a frequency of 27.12 MHz. This frequency is above 25 MHz. However, part of this signal is mirrored at the Nyquist frequency (=25 MHz) and is at 22.88 MHz (25 MHz–(27.12 MHz–25 MHz)) and can be digitized. The third harmonic (second harmonic wave) is at a frequency of 40.68 MHz. This is above 25 MHz. However, part of this signal is mirrored at the Nyquist frequency (=25 MHz) and is at 9.32 MHz (25 MHz–(40.68 MHz–25 MHz)). In summary, this means that the fundamental oscillation is 13.56 MHz, the first harmonic wave is mirrored at the Nyquist frequency at 22.88 MHz, and the second harmonic wave is mirrored at the Nyquist frequency at 9.32 MHz. By appropriately selecting the clock rate of the respective A/D converter, the Nyquist frequency can be selected in such a way that the mentioned signals are as far apart from one another as possible in order to be detected by using appropriate filters. This eliminates the need for expensive A/D converters.

In one development, the plasma ignition detection device is designed to adjust a frequency of the local oscillator of the first and second I/Q demodulator and/or the third and fourth I/Q demodulator to a frequency of the RF generator.

In one development, the plasma ignition detection device comprises:
a) a fifth and a sixth I/Q demodulator; or
b) a fifth, a sixth, a seventh and an eighth I/Q demodulator.

The output of the third A/D converter is connected to:
a) the fifth I/Q demodulator; or
b) the fifth and seventh I/Q demodulators.

The output of the fourth A/D converter is connected to:
a) the sixth I/Q demodulator; or
b) the seventh and eighth I/Q demodulators.

The plasma ignition detection device is designed to adjust a frequency of the local oscillators:
a) of the fifth and sixth I/Q demodulators to twice the frequency of an RF generator; or
b) of the fifth and sixth I/Q demodulators to double the frequency of an RF generator and of the seventh and eighth I/Q demodulators to triple the frequency of the RF generator.

This makes it possible that the first harmonic wave or the first and second harmonic waves are also detected accordingly for current and voltage.

In one development, the plasma ignition detection device comprises a signal processing device. I/Q outputs of the respective I/Q demodulators are connected to the signal processing device. The signal processing device is designed to perform one or more of the following operations:
a) signal filtering;
b) downsampling;
c) error correction.

Downsampling in this case refers in particular to downclocking, that is to say a conscious reduction of the clock rate and the associated data reduction.

Error correction in this case means, for example, the correction of amplitudes/phase errors and crosstalk. The signal processing device is further designed to generate complex values for voltage and current. It is advantageous here that the signal processing device outputs complex values for the respective voltage and the respective current. As a result, corresponding phase angles are available.

In one development, the voltage sensor of the first measuring unit is a capacitive voltage divider, wherein a first capacitance is formed by an electrically conductive ring or cylinder, through which an RF line between an RF generator and the impedance matching circuit can be guided. The current sensor of the first measuring unit is a coil arranged around the conductive ring or cylinder. In addition or as an alternative, the voltage sensor of the second measuring unit is a capacitive voltage divider, wherein a first capacitance is formed by an electrically conductive ring or cylinder, through which an RF line between the impedance matching circuit and a consumer (in the plasma chamber) can be guided. The current sensor of the second measuring unit is a coil arranged around the conductive ring or cylinder.

In one development, exactly one end face of the voltage sensor of the first and/or second measuring unit, which voltage sensor is designed as a conductive ring or cylinder, is earthed. In addition or as an alternative, the coil of the current sensor of the first and/or second measuring unit is a Rogowski coil. This enables accurate measured values to be obtained.

In one development, the first time-variant variable is a peak value or an average value over a large number of determined first time-variant variables. In addition or as an alternative, the second time-variant variable is a peak value or an average value over a large number of determined second time-variant variables. This smooths the recorded time-variant measured values.

In one development, the plasma ignition detection device is designed to continuously calculate new values for the first time-variant variable and the second time-variant variable using new first time-variant measured values and new second time-variant values. Depending on these new values for the first and second time-variant variables, a current output signal is then continuously generated. This calculation is made more than 1 time, 10 times, 100 times, 1000 times, 10000 times or more than 100000 times per second.

In one development, the plasma ignition detection device is designed to average a large number of first time-variant measured values and/or second time-variant values in order to calculate the first time-variant variable from the averaged first time-variant measured values and to calculate the second time-variant variable from the averaged second time-variant values. In addition or as an alternative, the plasma ignition detection device is also designed to average several values for the first time-variant variable and to average several values for the second time-variant variable in order to generate the output signal depending on this result. This "averaging" is preferably carried out over a relatively long period, for example over a period of 5 samples or more, in particular 10 samples or more. This is because the adjustment of the capacitances (for example via variable capacitors) always takes a certain amount of time. An instantaneous adjustment is usually not possible. Ignition can thus be detected before the motors have even started to change capacity, for example. Or even while they are running to identify at which impedance/motor position the ignition has occurred. For example, this position can be defined as a new starting position for the next process start.

The plasma generation system according to embodiments of the invention comprises the plasma ignition detection device. It also comprises an impedance matching circuit, wherein the first predetermined location is a region of the RF input of the impedance matching circuit and wherein the second location is a region of the RF output of the impedance matching circuit.

In one development, the plasma generation system comprises at least one RF generator and at least one consumer in the form of a plasma chamber. The RF generator can then be connected, in particular, to the RF input of the impedance matching circuit. A line length between the RF generator and the RF input of the impedance matching circuit may be longer than the line length between the RF output of the impedance matching circuit and the at least one consumer, in particular at least by a factor of 2, 3, 4, 5, 6, 7 or at least 8 times.

In one development, the plasma generation system comprises a display device, preferably in the form of a screen. The plasma ignition detection device is designed to represent the output signal on the display device. In particular, an output which describes the plasma state is displayed. The display device could also be a lamp system, wherein, for example, a green lamp represents a desired plasma state and a red lamp represents an undesired plasma state.

In one development, the plasma ignition detection device is designed to output an output signal to the RF generator and/or to the impedance matching circuit and/or a higher-level controller in the event that no desired plasma state is present, for which a desired plasma state has been generated in the past. In this case, it is possible to store output signals for which a desired plasma state has been set. These output signals can then be loaded and transmitted to the RF generator and/or to the impedance matching circuit and/or a higher-level controller. This increases the probability that a desired plasma state can be set.

In one development, the plasma generation system comprises an optical device which is arranged in the plasma chamber and is designed to detect the plasma state. The plasma ignition detection device is designed to also generate the output signal depending on the detected plasma state. There is thus another control authority which can be used to detect the actual current state of the plasma. Such a device can also advantageously be used for training by providing feedback on the state of the plasma, for example 'good', 'poor', 'ignited', 'not ignited', etc.

In one development, statistical evaluation may be provided. This may be effected, for example, by clustering. After a predetermined number of completed processes, for example, it is possible to detect 3, 4 or 5 states which have occurred often. Of these, state 1 may be 'not ignited'; state 2 may be 'ignited'. Additional states can be detected. For example, this could be several different 'good' and/or 'ignited' states for different process steps. In addition or as an alternative, other 'poor' and/or 'not ignited' and/or 'poorly ignited, plasma insufficiently formed' states could have been detected. It is then possible to output which of these states applies while the process is in progress. The assignment to one of these states could be determined and output in the form of a probability and, for example, be transmitted to a higher-level controller.

The higher-level controller can be connected to a cloud-based storage system or a cloud-based data processing system. Cloud-based here means an, in particular locally remote, preferably anonymized, storage or data processing device, in which in particular user ratings of more than one, advantageously of several tens, hundreds or several thousands of different users are stored. As a result, different users can contribute to the optimization of the method independently of the manufacturing site. It has been identified that the described methods will only be resoundingly successful, that is to say receive assignment information with the correct assignment with the highest probability, when several tens of thousands, in particular several hundred thousand user ratings, have been read out. Such an amount of data is often attainable in a predetermined period of time for an individual manufacturing facility. Various exemplary embodiments of the invention are described below by way of example with reference to the drawings. The same objects have the same reference signs. The corresponding figures in the drawings show in detail:

FIG. 1 shows a plasma generation system 100 which is used, among other things, for the surface treatment of workpieces.

The plasma generation system 100 comprises a plasma ignition detection device 1, an impedance matching circuit 50, an RF generator 60 and a plasma chamber 70 (consumer). The RF generator 60 is electrically connected to the impedance matching circuit 50. This is achieved via a first line 2a, which is preferably a first coaxial cable 2a. The first line 2a is connected to an output 60a of the RF generator 60 and to an input 50a of the impedance matching circuit 50. The impedance matching circuit 50 is also electrically connected to the plasma chamber 70. This is preferably achieved via a second line 2b, which is preferably a second coaxial piece. The second line 2b is connected to an output 50b of the impedance matching circuit 50 and to an input of the plasma chamber 70. The second line 2b is preferably connected to an electrode within the plasma chamber 70. The second line 2b is often very short, often coaxial, but preferably not designed as a cable.

The first line 2a is longer than the second line 2b. The first line 2a is preferably longer than the second line 2b by a factor of 2, 3, 4, 5, 6, 7 or at least 8.

The plasma generation system 100 preferably comprises a display device 80, which is preferably a screen.

The plasma chamber 70 may be considered a consumer. Depending on the application, for example one or more electrodes 3 may be provided in the plasma chamber 70, at least one of which is connected to the second line 2b. FIG. 1 uses dots to illustrate a plasma 4 within the plasma chamber 70.

The plasma generation system 100 preferably also comprises an optical device 90. The optical device 90 is further preferably arranged in the plasma chamber 70 and designed to visually detect the plasma 4 and thus the plasma state. The optical device 90 may be, for example, an optical conductor, such as a glass fibre. Although cameras can be used, they are often omitted for cost reasons. Thus, lenses and other protective glasses can quickly become cloudy due to the plasma 4.

In particular, the plasma ignition detection device 1 and the impedance matching circuit 50 are explained below.

The plasma ignition detection device 1 comprises a first measuring unit 5 and a second measuring unit 6. The first measuring unit 5 is designed to determine first time-variant measured values at a first predetermined location of the impedance matching circuit 50, where this determination is carried out by physical measurement. The first predetermined location is, in particular, the input 50a of the impedance matching circuit 50.

The second measuring unit 6 is designed to determine second time-variant values. This determination is carried out at a second predetermined location. These second time-variant values may be second time-variant measured values. This is the case if the determination is also carried out by way of a physical measurement. As an alternative, the determination can also be carried out by way of a calculation based on a physical model of the impedance matching circuit 50. The physical model includes current variables of the impedance matching circuit 50. These variables include, in particular, the current values of adjustable components such as capacitors, for example in the form of variable capacitors and, in particular, the resistance components including the parasitic resistance components. This calculation also includes the first time-variant measured values or variables of the first measuring unit 5 derived therefrom. The second predetermined location is, in particular, the output 50b of the impedance matching circuit 50.

A measuring unit 5, 6 which measures real variables is also referred to as a real measuring unit 5, 6. A measuring unit 5, 6 which determines corresponding values by calculation using a physical model is also referred to as a virtual measuring unit 5, 6.

The plasma ignition detection device 1 preferably comprises a processing unit 7, which is preferably a processor (for example digital signal processor (DSP) or microcontroller) and/or FPGA (Field Programmable Gate Array). Communication with the first and second measuring unit 5, 6 within the plasma ignition detection device 1 takes place via said processing unit 7. The plasma ignition detection device 1 can also communicate with the RF generator 60, the impedance matching circuit 50, the display device 80, a higher-level controller 81 and/or the optical device 90 via said processing unit 7.

The plasma ignition detection device 1 is designed to process first time-variant measured values. Said first time-variant measured values can be determined at the first location, for example, by the first measuring unit 5. A first reactive and/or active power is to be able to be determined from said first time-variant measured values. The plasma ignition detection device 1 is furthermore designed to process second time-variant values. Said second time-variant values can be determined, for example, by the second measuring unit 6 at the second location. A first reactive and/or active power is to be able to be determined from said second time-variant values.

Furthermore, the plasma ignition detection device 1 is to be designed to determine a first time-variant variable from the first measured values and a second time-variant variable from the second values.

Finally, the plasma ignition detection device 1 is designed to generate an output signal that describes, in particular, a plasma state of the plasma 4 in the plasma chamber 70, depending on the first and second time-variant variables.

The output signal may be, for example, a control command for actuating the impedance matching circuit 50. Said control command can indicate how the values of the adjustable components such as capacitors, for example in the form of variable capacitors, are to be changed. For example, the control command may include the information that the capacitance of the capacitor 1 is to be increased and the capacitance of the capacitor 2 is to be reduced or is to assume a certain value.

In addition or as an alternative, the output signal may include a control command for actuating the RF generator 60. For example, said control command may indicate that the RF generator 60 should be switched off. In addition or as an alternative, the control command can instruct the RF generator 60 to change its frequency and/or its output power.

In addition or as an alternative, the output signal may include an output message, which is presented by the display device 80.

The plasma ignition detection device 1 preferably comprises a storage device 8. The storage device 8 may be part of the processing unit 7 or separate from it, wherein the storage device 8 is designed to exchange data with the processing unit 7. Control commands for the impedance matching circuit 50 and/or for the RF generator 60 with respect to various first and second time-variant variables and/or first and second reactive and/or active powers and/or ratios of first and second reactive and/or active powers are stored in this storage device 8. The plasma ignition detection device 1 is then designed to load the corresponding control command for the impedance matching circuit 50 and/or the RF generator 60 from the memory device 8 based on the current first and second time-variant variables and/or based on the current first and second reactive and/or active powers and/or based on the ratios of current first and second reactive and/or active powers and to transmit same to the impedance matching circuit 50 and/or to the RF generator 60. This means that, in particular using a further data processing unit, the steps described above can be carried out to ensure that the plasma generation system 100 can be quickly brought into the desired (operating) state. When forming a ratio between the different powers as described above, the efficiency can be determined independently of the absolute input power or output power. Due to the ratio formation, this advantageously functions not only in certain operating states, but in a large value range of operating states.

In principle, it would also be conceivable that the plasma ignition detection device 1 has an AI module 9. The AI module 9 may be part of or separate from the processing unit 7. The AI module 9 is preferably designed to exchange data with the processing unit 7. The AI module 9 is preferably trained by the manufacturer in order to generate control commands for the impedance matching circuit 50 and/or for the RF generator 60 based on the first and second time-variant variables and/or based on the first and second reactive and/or active powers and/or based on the ratios of first and second reactive and/or active powers. The plasma ignition detection device 1 is then designed to transmit the generated control command to the impedance matching circuit 50 and/or the RF generator 60.

The AI module 9 preferably comprises several input nodes. These are part of an input layer. The first time-variant measured values which are determined at the first predetermined location of the first measuring unit 5 can be supplied to the input node. In addition or as an alternative, the first time-variant variable can also be supplied to the input node. The second time-variant values which are determined at the second predetermined location of the second measuring unit 6 are preferably also supplied to the input node. In addition or as an alternative, the second time-variant variable can also be supplied to the input node. The first time-variant measured values may be a current and a voltage or the power of a wave entering and leaving the first location. The second time-variant values may be a current and a voltage or the power of a wave entering and leaving the second location. In principle, the input node can also be supplied with a value for the power which flows into the first location and which flows out of the second location. As described above, a statistical evaluation can be provided here. This may be effected, for example, by clustering as described above.

The AI module 9 preferably likewise comprises one or more output nodes. These are part of an output layer. Such output nodes indicate, for example, how the values of the adjustable components such as capacitors, for example in the form of variable capacitors, are to be changed. In the simplest case, node 1 is mapped to capacitor 1 and node 2 is mapped to capacitor 2. Depending on the value of the node, a particular capacity is to be set or the capacity is to be increased or decreased. Thus, there may be one node for each adjustable element in the impedance matching circuit 50. In principle, there may be one or more additional nodes whose values lead to an adjustment (switch-on, switch-off, increase frequency, decrease frequency, increase power, decrease power) of the RF generator 60. There may also be a node which indicates whether the plasma 4 is in a desired state. This can then be used to generate an output signal in the form of an output message for the display device 80.

The AI module 9 preferably comprises one or more hidden layers which are used to connect the input nodes to the output nodes. Each hidden layer may contain the same number of nodes. The number of nodes in each hidden layer may also be different from one another. In principle, it is conceivable that each node of the input layer is connected to each node of the first hidden layer (the hidden layer arranged closest to the input layer). In principle, however, there may also be nodes of the input layer which are not connected to nodes of the first hidden layer.

In principle, the AI module 9 can be trained using supervised learning on the basis of recorded data. For this purpose, as previously described, the optical device 90 can provide feedback about the state of the plasma. First time-variant measured values and second time-variant values of already existing installations of a plasma generation system 100, in addition to the set and verified plasma state and/or in addition to the generated control commands for the RF generator 60 and/or the impedance matching circuit 50, can thus be used to train the AI module 9 accordingly. It is thus possible to monitor whether the AI module 9 generates the correct output signal in the form of a control command for actuating the impedance matching circuit 50 or for actuating the RF generator 60 for certain first time-variant measured values and second time-variant values.

The plasma ignition detection device 1 is designed, in particular, to interlink the first time-variant variable and the second time-variant variable by way of at least one mathematical operation. In addition or as an alternative, the first reactive and/or active power and the second reactive and/or active power can also be interlinked by way of at least one mathematical operation. The output signal can then be generated depending on the respective result.

The plasma ignition detection device 1 is preferably designed to divide the second reactive and/or active power by the first reactive and/or active power (one possible mathematical operation) in order to calculate an efficiency thereby. The output signal is then generated depending on the efficiency. It is assumed here that the second reactive and/or active power is determined closer to the output 50*b* or to the output 50*b* of the impedance matching circuit 50 and that the first reactive and/or active power is determined closer to the input 50*a* or to the input 50*a* of the impedance matching circuit 50. If this were reversed, the first reactive and/or active power would have to be divided by the second reactive and/or active power.

More preferably, the plasma ignition detection device 1 is designed to generate the output signal only when the first time-variant variable and/or the first reactive and/or active power exceeds a threshold value. In addition or as an alternative, this also applies if the second time-variant variable and/or the second reactive and/or active power should exceed a threshold value. Especially when the plasma generation system 100 is started up, there may possibly be states in which a comparison of the first reactive and/or active power with the second reactive and/or active power that is carried out too early could lead to insufficient control.

The first time-variant variable is preferably a reactive power or an active power and the second time-variant variable is more preferably a reactive power or an active power. The reactive power or the active power for the first and/or second location could then be supplied to the AI module 9 at its input node.

As explained, the first location may be situated in a region of an RF input 50*a* of the impedance matching circuit 50 and the second location may be situated in a region of an RF output 50*b* of the impedance matching circuit 50. This may also be the other way around.

FIGS. 2A and 2B show various exemplary embodiments of the impedance matching circuit 50. In FIG. 2A, the impedance matching circuit 50 is L-shaped. In FIG. 2B, the impedance matching circuit 50 is T-shaped.

In FIG. 2A, the input 50*a* of the impedance matching circuit 50 is connected to a first coil 10 (first inductance) and to a second coil 11 (second inductance). The first and second coils 10, 11 are connected by way of their first connection to a common node and thus to the input 50*a* of the impedance matching circuit 50. The first coil 10 is connected to a reference earth via a first capacitor 12 (first capacitance). The second coil 11 is connected to the output 50*b* via a second capacitor 13 (second capacitance). The first and second capacitors 12, 13 are adjustable components, in particular in the form of variable capacitors, the capacitance of which can be changed via stepper motors. In particular, the plate distance between the first and second capacitors 12, 13 can be changed. The plasma ignition detection device 1 is designed to actuate the respective stepper motors accordingly. As an alternative or in addition, electronically variable capacitances, for example capacitor arrays which can be switched on and off, can be used to set the capacitor values. In principle, the actuation can be carried out by the processing unit 7. The capacitances of the first and second capacitors 12, 13 can be adjusted independently of one another. The impedance matching circuit 50 is preferably free of further components. Of course, the position of the first coil 10 and the first capacitor 12 can also be swapped. In this case, the first capacitor 12 is arranged at the input 50*a* of the impedance matching circuit 50 and the first coil 10 is arranged at the reference earth. In addition or as an alternative, the position of the second coil 11 and the second capacitor 13 can also be swapped. In this case, the second capacitor 13 is arranged at the input 50*a* of the impedance matching circuit 50 and the second coil 11 is arranged at the reference earth.

In FIG. 2B, the input 50*a* of the impedance matching circuit 50 is connected to the first capacitor 12 (first capacitance). The first capacitor 12 is connected both to the first coil 10 (first inductance) and to the second coil 11 (second inductance). This is achieved via a common node to which both the first capacitor 12 and the first and second coils 10, 11 are connected. The first coil 10 is also connected to the reference earth. The second coil 11 is connected (series circuit) to the second capacitor 13 (second capacitance). The second capacitor 13 is connected to the output 50*b* of the impedance matching circuit 50. The position of the second coil 11 and the second capacitor 13 could also be swapped. In this case, the second capacitor 13 would be connected to the common node and the second coil 11 would be connected to the output 50*b* of the impedance matching circuit 50. The impedance matching circuit 50 is preferably free of further components.

Figure 2C:
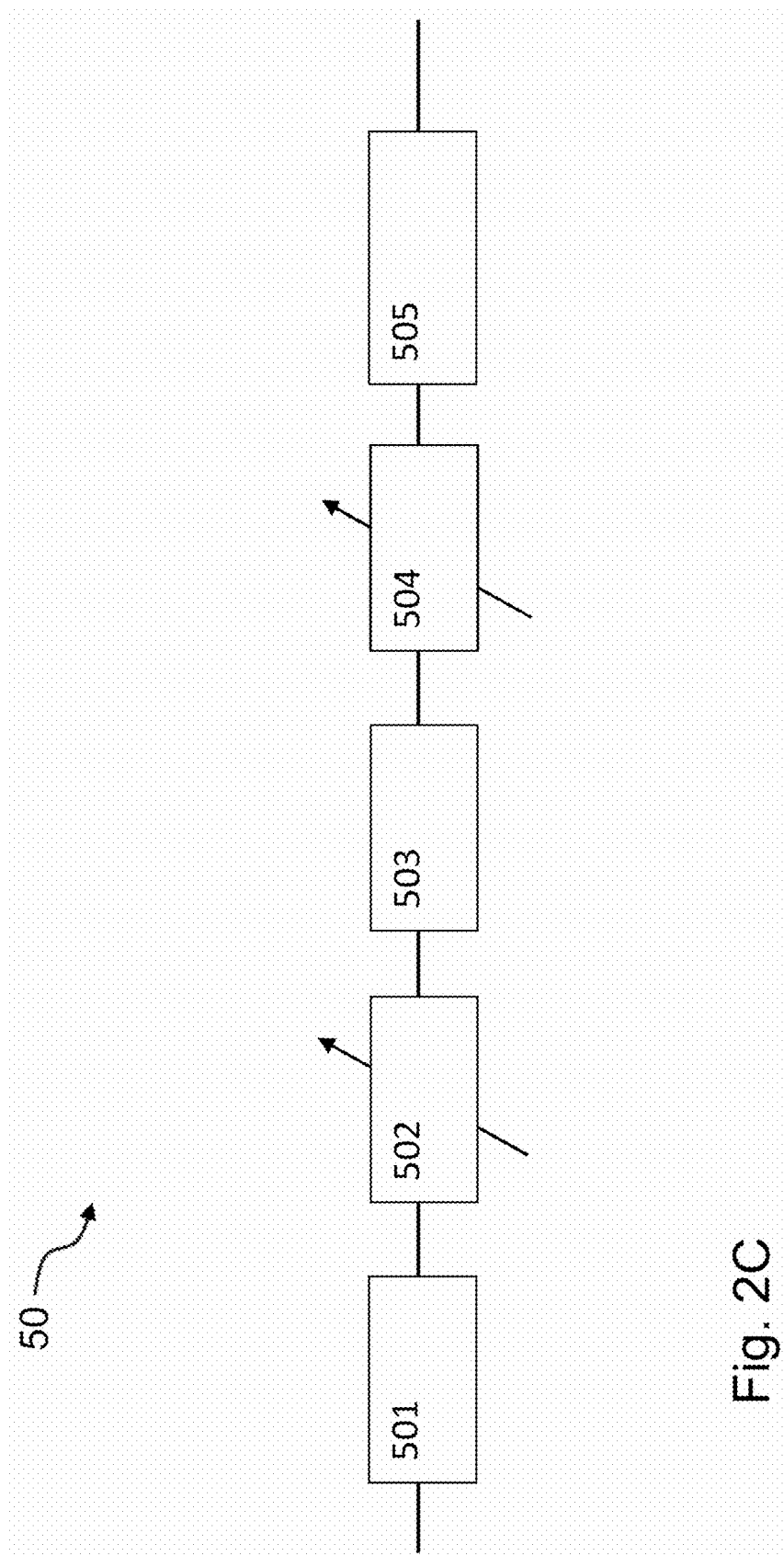

In principle, each impedance matching circuit 50 can be described as a series of two-port networks 501 to 505. A two-port network is a model for an electrical component or an electrical network with four terminals, in which two terminals are combined into a so-called port. A port is present when the electrical current through both terminals of a port is in opposition, that is to say the port condition is met. A two-port network is a specific form of a general four-pole. A maximum of one variable component is arranged in each two-port network, but a variable component does not have to be arranged in each two-port network. An example of this is shown in FIG. 2C. The first two-port network 501 is a readjustment system without a variable element. The following two-port network 502 has a first variable element, for example the first capacitor 12 from FIG. 2A or 2B. The following two-port network 503 here is an intermediate adjustment system without a variable element. The in turn following two-port network 504 has a second variable element, for example the second capacitor 13 from FIG. 2A or 2B. The following two-port network 505 is a preadjustment system without a variable element. It is not necessary for each of the two-port networks to be present. A plurality thereof may also be combined.

Figure 3:
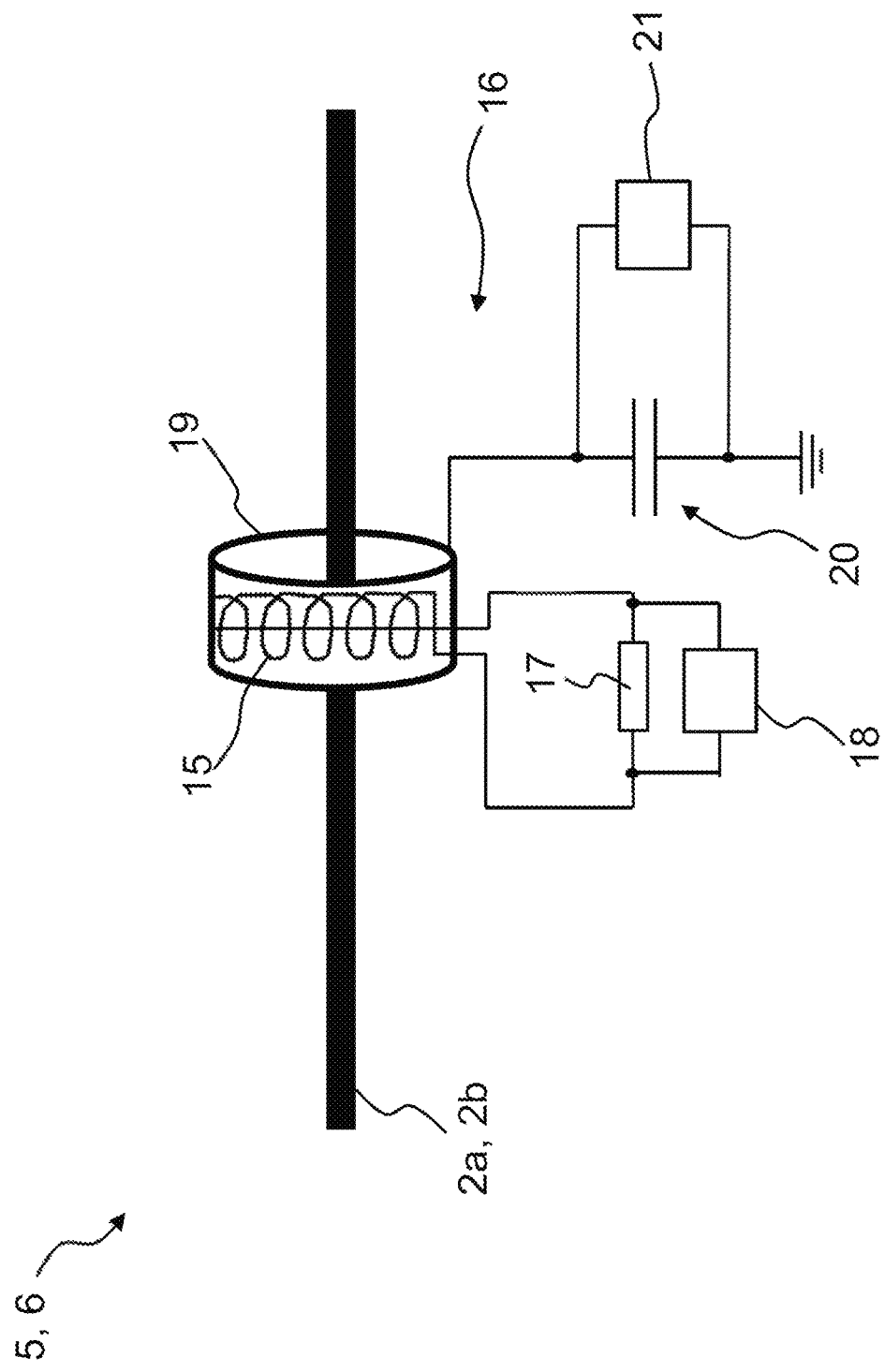
FIG. 3 shows various exemplary embodiments of a first and/or second measuring unit to contactlessly measure a voltage and a current.

FIG. 3 shows an exemplary embodiment of a possible structure of the first and/or second measuring unit 5, 6. In this exemplary embodiment, the first and/or second measuring unit 5, 6 is designed to contactlessly measure a voltage and a current.

For this purpose, the first or second measuring unit 5, 6 comprises a current sensor 15 and a voltage sensor 16. The first and second time-variant measured values are therefore a current and a voltage.

However, the phase relationship is still preferably measured. Therefore, the first and second time-variant measured values are a complex current and a complex voltage. When a directional coupler is used for measuring, at least one active power measurement can be obtained even without phase measurement. This is a major advantage of the directional coupler. However, the accuracy is reduced by the limited directional acuity in the case of impedances far away from the impedance which is characteristic of the directional coupler.

The current sensor 15 of the first and/or second measuring unit 5, 6 is a coil, in particular in the form of a Rogowski coil.

Both ends of the coil are preferably connected to one another via a shunt resistor 17. The voltage which drops across the shunt resistor 17 can be digitized by means of a first A/D converter 18.

The voltage sensor 16 of the first and/or second measuring unit 5, 6 is preferably designed as a capacitive voltage divider. A first capacitance 19 is formed by an electrically conductive ring 19. An electrically conductive cylinder could also be used. The corresponding first or second line 2*a*, 2*b* is guided through said electrically conductive ring 19. A second capacitance 20 of the voltage sensor 16 designed as a voltage divider is connected to the reference earth. A second A/D converter 21, which is designed to detect and digitize the voltage which drops across the second capacitance 20, is connected in parallel with the second capacitance 20.

In principle, the first measuring unit 5 and the second measuring unit 6 can also be arranged or be constructed on a (common) printed circuit board. The first capacitance 19 may be formed by a coating on a first and an opposite second side of the printed circuit board. In this case, the coatings on the first and second sides are electrically connected to one another by means of vias. The first or second line 2*a*, 2*b* is guided through an opening in the printed circuit board. The second capacitance 20 may be formed by a discrete component.

The current sensor 15 in the form of the coil, in particular in the form of the Rogowski coil, is spaced further apart from the first or second line 2*a*, 2*b* than the first capacitance 19. The coil may also be formed on the same printed circuit board by appropriate coatings as well as vias. The coil for current measurement and the first capacitance for voltage measurement preferably pass through a common plane.

The shunt resistor 17 can also be arranged on said printed circuit board. Exactly the same also applies to the first and/or second A/D converter 18, 21.

Figure 4:
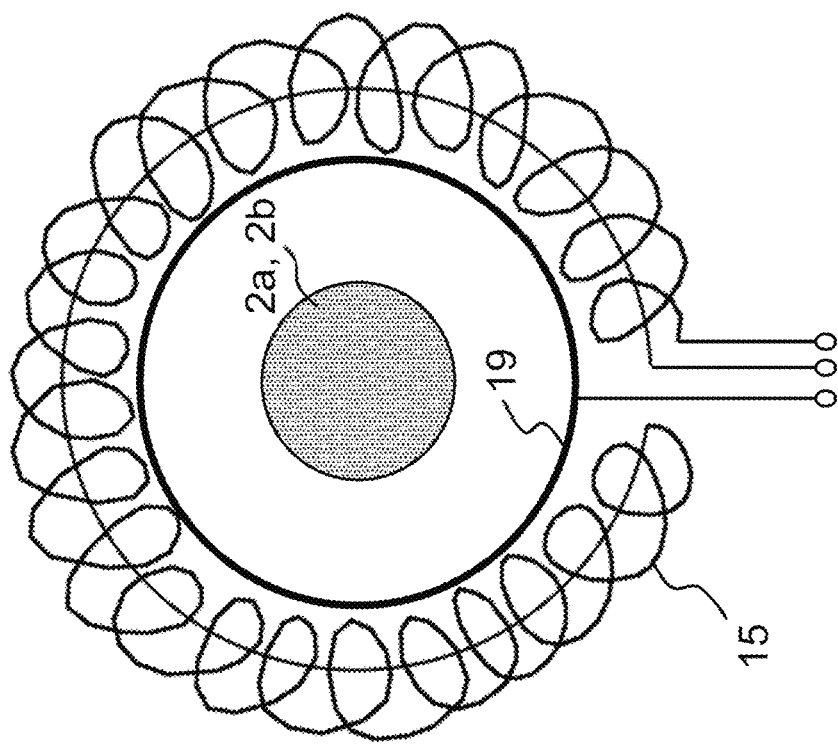
FIG. 4 shows a different view of the first and/or second measuring unit according to some embodiments.

FIG. 4 shows another view of FIG. 3, in particular in the form of a partial sectional illustration through the first and second lines 2*a*, 2*b*, the first capacitance 19 and the current sensor 15 in the form of the coil, in particular in the form of the Rogowski coil. It can be seen that the coil is bent around the annular first capacitance 19. The coil is in this case electrically isolated from the first capacitance 19. The coil comprises a spiral winding (preferably colour-isolated) and is placed around the outer sheath of the annular first capacitance 19. A second end of said winding is passed through the reception space clamped by the winding so that it exits at the first end of the winding. The coil is preferably wound by more than 270° around the annular first capacitance 19.

In principle, it would be conceivable for exactly one end face of the part (first capacitance) of the voltage sensor 16 of the first and/or second measuring unit 5, 6 that is designed as a conductive ring 19 or cylinder, to be earthed. The second end face is preferably electrically connected to the second capacitance 20.

In another embodiment (not shown), the first and/or second measuring unit 5, 6 could comprise a directional coupler.

In this case, the first time-variant measured values (recorded at the first location) are powers of the incoming and outgoing wave (into the first location) and the second time-variant measured values (recorded at the second location) are powers of the outgoing and incoming wave (into the second location). The plasma ignition detection device 1 is designed to subtract the power of the outgoing wave from the power of the incoming wave in order to thereby calculate the first time-variant variable. The plasma ignition detection device 1 is designed to subtract the power of the incoming wave from the power of the outgoing wave in order to thereby calculate the second time-variant variable.

As mentioned at the beginning, there may also be a mixed setup. The first measuring unit 5 may thus comprise a current sensor 15 and a voltage sensor 16 and the second measuring unit 6 may thus comprise a directional coupler. The reverse would likewise be conceivable.

As also mentioned at the beginning, one of the two measuring units 5, 6 may also be a virtual measuring unit, such that the time-variant measured values or the time-variant variable correspondingly calculated from this is not measured but is calculated on the basis of a physical model of the impedance matching circuit 50 and the time-variant measured values or the time-variant variable of the other (real) measuring unit 5, 6 calculated therefrom.

Figure 5A:
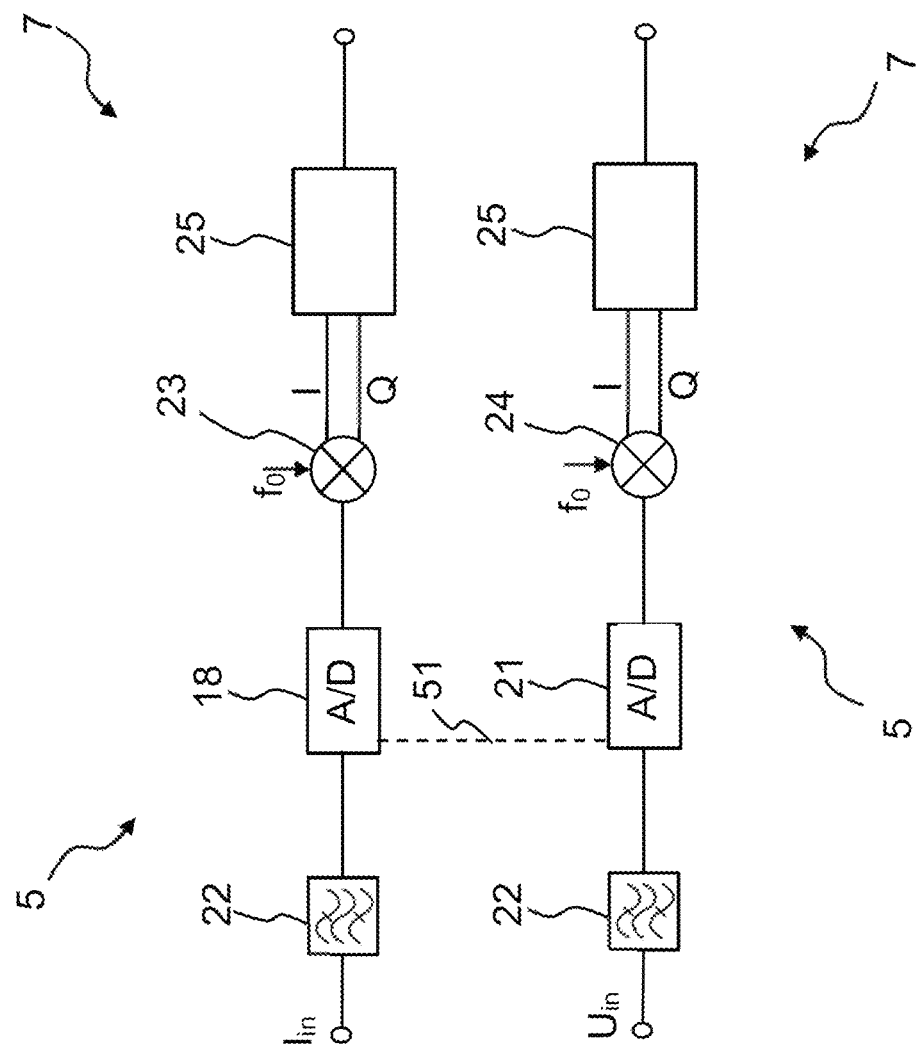
FIGS. 5A and 5B show two exemplary embodiments of digitizing voltage and current and resolving the phase relationship between voltage and current.

FIG. 5A shows an exemplary embodiment for digitizing time-variant measured values for a current and a voltage and for resolving the phase relationship between current and voltage. The time-variant measured values for the current (analogue current signal) which ensure for example a voltage drop across the shunt resistor 17 or the time-variant measured values for the voltage (analogue voltage signal), which drop across the second capacitance 20 of the voltage sensor 16 formed as a voltage divider are preferably filtered via a first filter 22 respectively. The first filter 22 in this case is a bandpass. There is a first filter 22 of this kind for filtering time-variant measured values for the voltage and there is a filter 22 of this kind for filtering time-variant measured values for the current. Other filter types (for example lowpass) would also be conceivable. The filtered current signal is subsequently digitized by the first A/D converter 18. Exactly the same also applies to the filtered voltage signal which is digitized by the second A/D converter 21.

The digitized time-variant measured values for the current output by the first A/D converter 18 are supplied to a first I/Q demodulator 23 which outputs an I/Q signal for the digitized time-variant measured values for the current. The digitized time-variant measured values for the voltage output by the second A/D converter 21 are supplied to a second I/Q demodulator 24 which outputs an I/Q signal for the digitized time-variant measured values for the voltage. The first A/D converter 18 and the first I/Q demodulator 23 can be integrated into a common chip. The same can also apply to the second A/D converter 21 and the second I/Q demodulator 24.

The frequency of the first and second I/Q demodulators 23, 24 is preferably set to the frequency of the RF generator 60.

The plasma ignition detection device 1 furthermore comprises a signal processing device 25. The outputs of the first and second I/Q demodulators 23, 24 are connected to said signal processing device 25. The signal processing device 25 is designed to perform one or more of the following operations: signal filtering, downsampling and error correction. The signal processing device 25 is further designed to generate complex values for voltage and current.

The structures shown in FIG. 5A may be part of the respective first or second measuring unit 5, 6. These are preferably part of the first measuring unit 5, wherein the first measuring unit 5 detects a current and a voltage at the first location (at the input 50a of the impedance matching circuit 50). The signal processing device 25 may be formed by the processing unit 7. The signal processing device 25 may also be formed separately to the processing unit 7. The first and second I/Q demodulators 23, 24 may also be part of the signal processing device 25 or the processing unit 7.

The plasma ignition detection device 1 is designed to calculate the first active power from the (in this case) first time-variant measured values based on the magnitude for current and voltage and the respective phase for current and voltage as follows: $|U| \cdot |I| \cdot \cos(\varphi_U - \varphi_I)$ or $|U| \cdot |I| \cdot \cos(\varphi_I - \varphi_U)$ where $\varphi_U$=phase voltage and $\varphi_I$=phase current. In principle, the plasma ignition detection device 1 could also calculate the first reactive power from these first time-variant measured values as follows: $|U| \cdot |I| \cdot \sin(\varphi_U - \varphi_I)$ or $|U| \cdot |I| \cdot \sin(\varphi_I - \varphi_U)$ where $\varphi_U$=phase voltage and $\varphi_I$=phase current. The active power or reactive power is then the first time-variant variable.

The plasma ignition detection device 1 is designed to continuously calculate new values for the first time-variant variable using new first time-variant measured values.

Figure 5B:
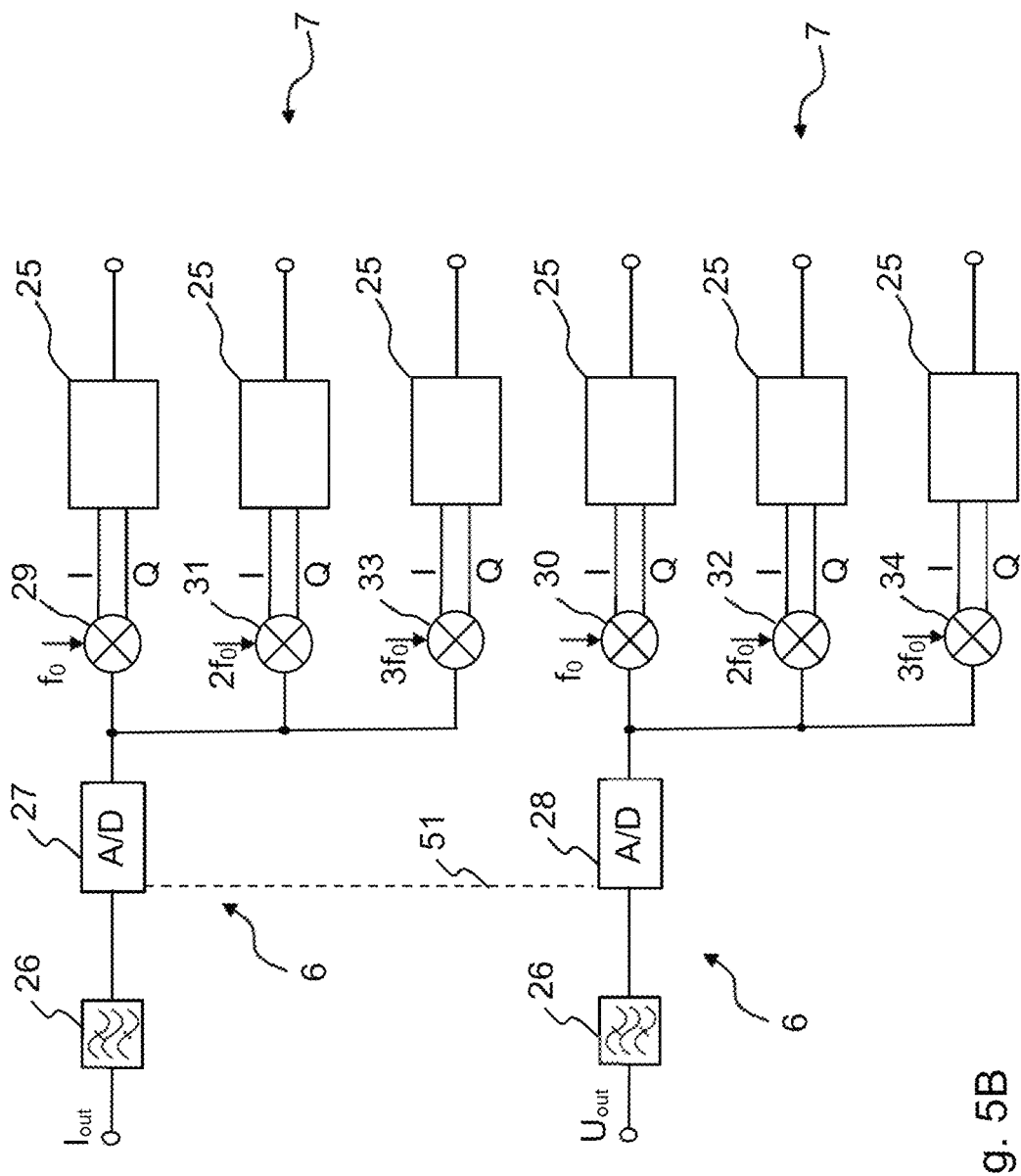

FIG. 5B shows another exemplary embodiment for digitizing time-variant measured values for a current and a voltage and for resolving the phase relationship between current and voltage. This exemplary embodiment shows how the second time-variant measured values are detected. Said second time-variant measured values are preferably a current and a voltage which are determined at the second location (output 50b of the impedance matching circuit 50).

The time-variant measured values for the current (analogue current signal) which ensure for example a voltage drop across the shunt resistor 17 or the time-variant measured values for the voltage (analogue voltage signal), which drop across the second capacitance 20 of the voltage sensor 16 formed as a voltage divider are preferably filtered via a second filter 26 respectively. The second filter 26 in this case is a bandpass. Other filter types (for example lowpass) would also be conceivable. The filtered current signal is subsequently digitized by a third A/D converter 27. Exactly the same also applies to the filtered voltage signal which is digitized by a fourth A/D converter 28.

The digitized time-variant measured values for the current output by the third A/D converter 27 are supplied to a third I/Q demodulator 29 which outputs an I/Q signal for the digitized time-variant measured values for the current. The digitized time-variant measured values for the voltage output by the fourth A/D converter 28 are supplied to a fourth I/Q demodulator 30 which outputs an I/Q signal for the digitized time-variant measured values for the voltage. The third A/D converter 27 and the third I/Q demodulator 29 can be integrated into a common chip. The same can also apply to the fourth A/D converter 28 and the fourth I/Q demodulator 30.

The frequency of the third and fourth I/Q demodulators 29, 30 is preferably set to the frequency of the RF generator 60.

The outputs of the third and fourth I/Q demodulators 29, 30 are connected to the signal processing device 25. The signal processing device 25 is designed to perform one or more of the following operations: signal filtering, downsampling and error correction. The signal processing device 25 is further designed to generate complex values for voltage and current. These are the second time-variant measured values.

The plasma ignition detection device 1 is designed to calculate the second active power from the (in this case) second time-variant measured values based on the magnitude for current and voltage and the respective phase for current and voltage as follows: $|U| \cdot |I| \cdot \cos(\varphi_U - \varphi_I)$ or $|U| \cdot |I| \cdot \cos(\varphi_I - \varphi_U)$ where $\varphi_U$=phase voltage and $\varphi_I$=phase current. In principle, the plasma ignition detection device 1 could also calculate the second reactive power from these second time-variant measured values as follows: $|U| \cdot |I| \cdot \sin(\varphi_U - \varphi_I)$ or $|U| \cdot |I| \cdot \sin(\varphi_I - \varphi_U)$ where $\varphi_U$=phase voltage and $\varphi_I$=phase current. The active power or reactive power is then the second time-variant variable.

The plasma ignition detection device 1 is designed to continuously calculate new values for the second time-variant variable using new second time-variant measured values.

In FIG. 5B, the second harmonic (first harmonic wave) and optionally the third harmonic (second harmonic wave) of the current and the voltage of the second time-variant measured values are also determined. This is preferably achieved only at the second location, that is to say at the output 50b of the impedance matching circuit 50. The concept is not limited to measuring the three harmonics. In principle, there could be several if they fit into the baseband.

For this purpose, the plasma ignition detection device 1 comprises a fifth and a sixth I/Q demodulator 31, 32 and optionally also a seventh and an eighth I/Q demodulator 33, 34.

The output of the third A/D converter 27 is connected to the fifth I/Q demodulator 31 and optionally also to the seventh I/Q demodulator 33.

The output of the fourth A/D converter 28 is connected to the sixth I/Q demodulator 32 and optionally also to the eighth I/Q demodulator 34.

The frequency of the fifth and sixth I/Q demodulators 31, 32 is preferably set to double the frequency of the RF generator 60.

The frequency of the optional seventh and optional eighth I/Q demodulators 33, 34 is preferably set to three times the frequency of the RF generator 60.

The outputs of the fifth, sixth, and optionally seventh and optionally eighth I/Q demodulators 31, 32, 33, 34 are connected to the signal processing device 25. The signal processing device 25 is designed to perform one or more of the following operations: signal filtering, downsampling and error correction. The signal processing device 25 is further designed to generate complex values for the second harmonic and optionally the third harmonic for current and voltage. These values are then preferably added to the respective current and voltage values of the first harmonic (fundamental oscillation). This would then result, for example, in the second time-variant measured values.

The plasma ignition detection device 1 is designed to adjust the clock rate of the third and fourth A/D converters 27, 28 such that a fundamental oscillation of the RF generator 60 and a second harmonic (first harmonic wave) of the RF generator 60 and optionally a third harmonic (second harmonic wave) of the RF generator 60, wherein the second harmonic of the RF generator 60 and the optional third harmonic of the RF generator 60 are mirrored at the Nyquist frequency of the third and fourth A/D converters 27, 28, are spaced from one another by a predetermined or maximum frequency range below the Nyquist frequency. It is possible for the signal processing device 25 to separate the respective signals (fundamental oscillation, mirrored second harmonic and optionally mirrored third harmonic for current and voltage) from one another by this distance which can then be achieved. This enables the second harmonic and the optional third harmonic to be analysed independently of one another and independently of the fundamental oscillation, enabling more accurate conclusions to be drawn about the plasma state of the plasma 4. The A/D converters 18 and 21 in FIG. 5A and 27, 28 in FIG. 5B preferably run synchronously, that is to say they are connected, for example, to a synchronizing clock signal 51.

The plasma ignition detection device 1 is also designed to calculate the second harmonic (first harmonic wave) and the optional third harmonic (second harmonic wave) of the second reactive and/or active power.

The plasma ignition detection device 1 is designed to average a plurality of first time-variant measured values and/or second time-variant (measured) values in order to calculate the first time-variant variable from the averaged first time-variant measured values and the second time-variant variable from the averaged second time-variant (measured) values. In addition or as an alternative, the plasma ignition detection device 1 is designed to average several values for the first time-variant variable and to average several values for the second time-variant variable in order to generate the output signal depending on this.

The first and/or second time-variant variable is a peak value or an average value over a large number of determined first and/or second time-variant variables.

The plasma ignition detection device 1 is designed to continuously calculate new values for the first time-variant variable and the second time-variant variable using new first time-variant measured values and new second time-variant (measured) values in order to generate a new output signal depending on said new values.

Figure 6:
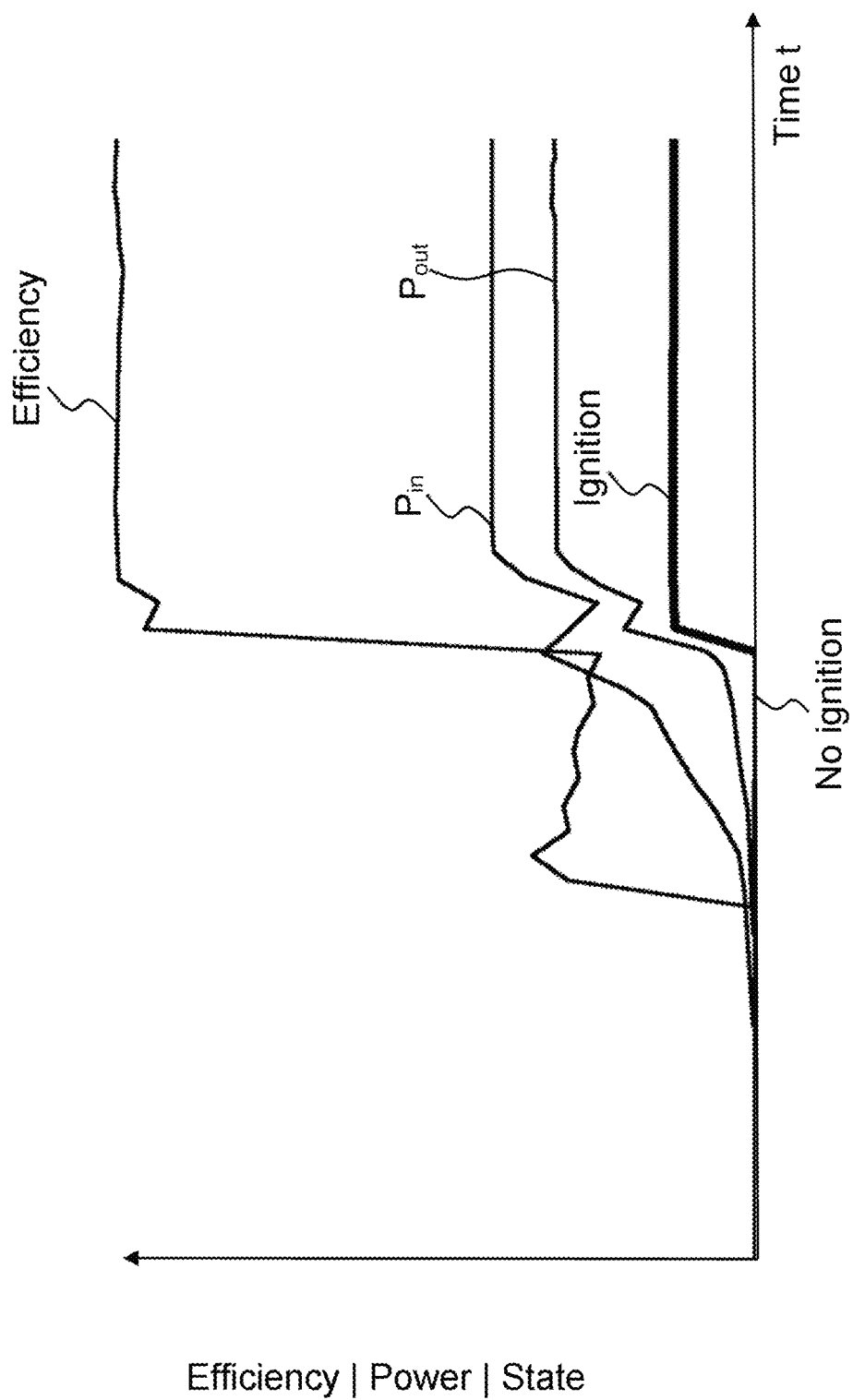
FIG. 6 shows a graph showing that high efficiency is an indication of a desired plasma state.

FIG. 6 shows a graph showing that a high efficiency is an indication of a desired plasma state. In this case, the plasma 4 is ignited. It is shown that the input power $P_{in}$ increases from a certain point in time. This is due to the fact that the RF generator 60 outputs a corresponding output signal at a particular frequency $f_0$. The input power $P_{in}$ is measured at the first location, that is to say at the input 50a of the impedance matching circuit 50. This can be done via a directional coupler or via the corresponding current and voltage sensors 15, 16. The output power $P_{out}$ then also increases separately thereto. The output power $P_{out}$ is measured at the second location, that is to say at the output 50b of the impedance matching circuit 50. The efficiency is above a certain threshold value, and so it can be assumed that the plasma 4 is ignited. This is confirmed by the optical device 90 ("ignition").

Figure 7:
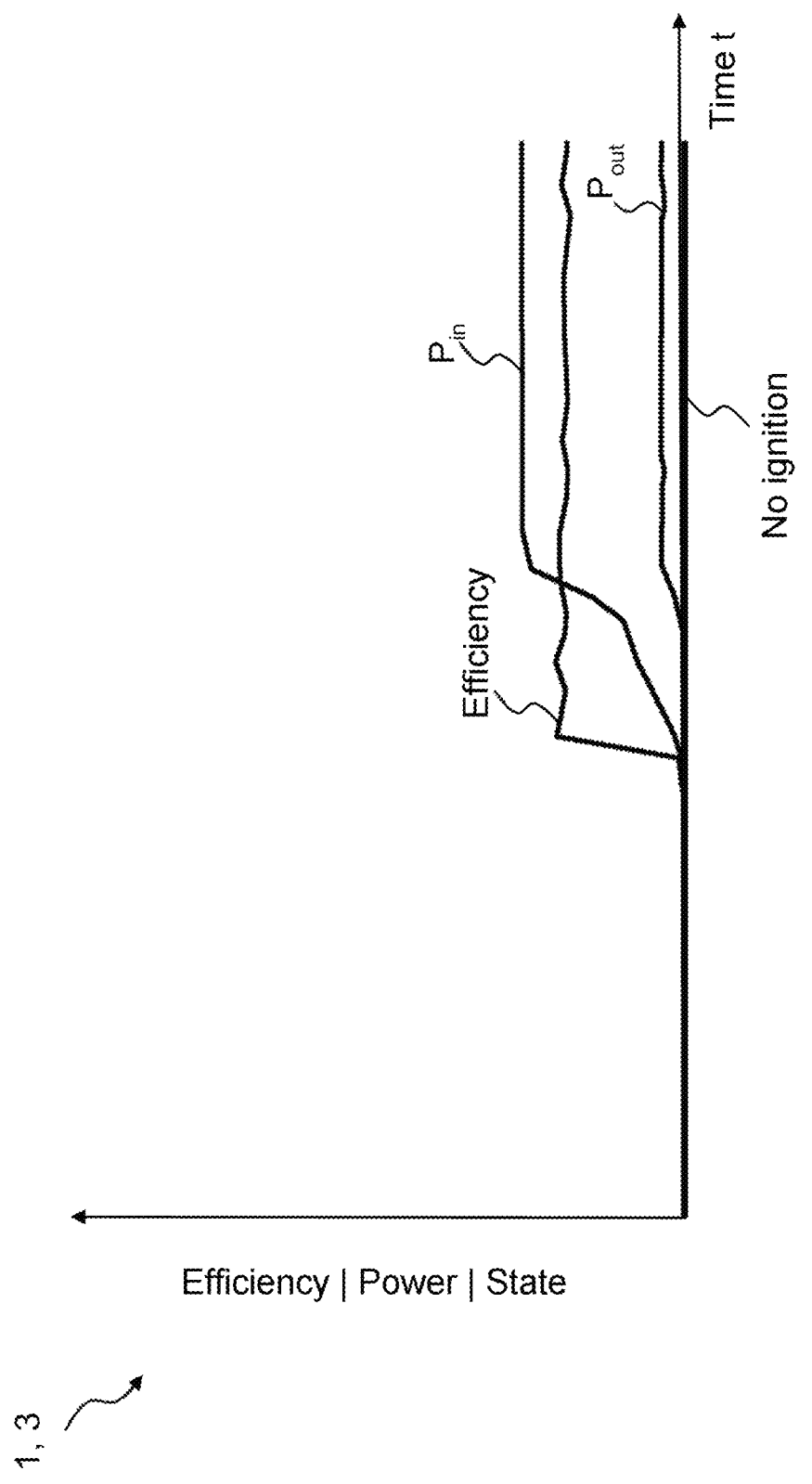
FIG. 7 shows a graph showing that low efficiency is an indication of an undesired plasma state.

FIG. 7, in contrast, shows a graph showing that a low efficiency is an indication of an undesired plasma state. In this case, the plasma 4 is not ignited. The efficiency is lower than in the graph in FIG. 6. The output power $P_{out}$ is also lower than the output power from the graph in FIG. 6. In this case, the optical device 90 does not detect ignition of the plasma 4. This corresponds to the calculated efficiency. In principle, it is possible to say that the plasma 4 is not in a desired state when the efficiency is below a first threshold value. If the efficiency is above a second threshold value, it is highly likely that the plasma 4 is in a desired state. The first and second threshold values may be the same. The second threshold value may also be above the first threshold value, and so, for a range between the first and the second threshold value, no clear statement about the plasma 4 would be able to be made and, for example, more first time-variant measured values and more second time-variant (measured) values would have to be collected. In this case, for example, the second harmonic and the optional third harmonic could be evaluated in amplified form.

All the described and/or depicted features can be combined with one another as desired.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A plasma ignition detection device for connecting to an impedance matching circuit for a plasma generation system, the plasma ignition detection device configured to:
   process first time-variant measured values, from a first predetermined location of the impedance matching circuit, wherein an applied first reactive and/or active power is capable of being determined from the first time-variant measured values;
   process second time-variant values which are associated with a second location of the impedance matching circuit, wherein the second location is different to the first predetermined location, wherein an applied second reactive and/or active power is capable of being determined from the second time-variant values;
   determine a first time-variant variable from the first time-variant measured values;
   determine a second time-variant variable from the second time-variant values; and
   generate an output signal which describes a plasma state, depending on the first and second time-variant variables.

2. The plasma ignition detection device according to claim 1, wherein:
   the output signal is:
   a control command for actuating the impedance matching circuit, and/or
   for an RF generator of the plasma generation system; and/or
   an output message.

3. The plasma ignition detection device according to claim 2, further comprising:
   a storage device, wherein, control commands with respect to:
   the first and second time-variant variables; and/or
   the first and second reactive and/or active powers; and/or
   ratios of first and second reactive and/or active powers;
   for the impedance matching circuit and/or for the RF generator are stored in the storage device;
   the plasma ignition detection device further configured to take:
   current first and second time-variant variables; and/or
   current first and second reactive and/or active powers; and/or
   ratios of the current first and second reactive and/or active powers;
   as a basis for loading corresponding control command for the impedance matching circuit and/or the RF generator from the storage device, and to
   transmit the corresponding control command to the impedance matching circuit and/or to the RF generator.

4. The plasma ignition detection device according to claim 2, further comprising:
   an artificial intelligence (AI) module which is trained by a manufacturer in order to take:
   the first and second time-variant variables; and/or
   the first and second reactive and/or active powers; and/or
   ratios of first and second reactive and/or active powers;
   as a basis for generating the control command for the impedance matching circuit and/or for the RF generator.

5. The plasma ignition detection device according to claim 1, further configured to:
   interlink the first time-variant variable and the second time-variant variable by way of at least one mathematical operation; and/or
   interlink the first reactive and/or active power and the second reactive and/or active power by way of at least one mathematical operation;
   in order to generate the output signal.

6. The plasma ignition detection device according to claim 5, further configured to:
   divide the second reactive and/or active power by the first reactive and/or active power in order to calculate an efficiency in order to generate the output signal as a function of the efficiency.

7. The plasma ignition detection device according to claim 1, further configured to:
   generate the output signal only when:
   the first time-variant variable and/or the first reactive and/or active power exceeds a first threshold value; and/or
   the second time-variant variable and/or the second reactive and/or active power exceeds a second threshold value.

8. The plasma ignition detection device according to claim 1, wherein:
   the first time-variant variable is the first reactive power or an active power; and/or
   the second time-variant variable is the second reactive power or an active power.

9. The plasma ignition detection device according to claim 1, further configured to:
   calculate a first harmonic wave, or
   the first harmonic wave and a second harmonic wave of the second reactive and/or active power;
   generate the output signal depending on a power of:
   the first harmonic wave; or
   the first and second harmonic waves
   of the second reactive and/or active power.

10. The plasma ignition detection device according to claim 1, wherein:
    the first predetermined location is situated in a region of an RF input of the impedance matching circuit, and the second location is situated in a region of an RF output of the impedance matching circuit; or
    the first predetermined location is situated in the region of the RF output of the impedance matching circuit, and the second location is situated in the region of the RF input of the impedance matching circuit.

11. The plasma ignition detection device according to claim 1, further comprising:
    a first measuring unit configured to determine the first time-variant measured values at the first predetermined location of the impedance matching circuit, where the determination by the first measuring unit is carried out by a first physical measurement;
    a second measuring unit configured to determine the second time-variant values, wherein:
    the determination by the second measuring unit is carried out by a second physical measurement at the second location, thereby the second time-variant values are second time-variant measured values; or the determination by the second measuring unit is carried out by a calculation based on a physical model of the impedance matching circuit, and:
the first time-variant measured values; and/or
the first time-variant variable.

12. The plasma ignition detection device according to claim 11, wherein:
the first measuring unit comprises a first directional coupler; and/or
the second measuring unit comprises a second directional coupler.

13. The plasma ignition detection device according to claim 12, wherein:
the first time-variant measured values are powers of an incoming and outgoing wave and the second time-variant measured values are powers of the outgoing and incoming wave;
the plasma ignition detection device further configured to:
subtract the power of the outgoing wave from the power of the incoming wave in order to calculate the first time-variant variable;
subtract the power of the incoming wave from the power of the outgoing wave in order to calculate the second time-variant variable.

14. The plasma ignition detection device according to claim 11, wherein:
the first measuring unit comprises a first current sensor and a first voltage sensor, wherein the first time-variant measured values are a first current and a first voltage; and/or
the second measuring unit comprises a second current sensor and a second voltage sensor, wherein the second time-variant measured values are a second current and a second voltage.

15. The plasma ignition detection device according to claim 14, wherein:
the first time-variant measured values are a first complex current and a first complex voltage; and/or
the second time-variant measured values are a second complex current and a second complex voltage.

* * * * *